(12) United States Patent
Hwang et al.

(10) Patent No.: US 7,233,718 B2
(45) Date of Patent: Jun. 19, 2007

(54) OPTICAL DEVICE AND METHOD OF MANUFACTURING THE SAME

(75) Inventors: Seong-mo Hwang, Suwon-si (KR); Young-hun Kim, Seoul (KR); Seung-ho Nam, Seongnam-si (KR); Young-chan Kim, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 21 days.

(21) Appl. No.: 11/012,728

(22) Filed: Dec. 16, 2004

(65) Prior Publication Data

US 2005/0169593 A1 Aug. 4, 2005

(30) Foreign Application Priority Data

Dec. 17, 2003 (KR) .................. 10-2003-0092504

(51) Int. Cl.
*G02B 6/28* (2006.01)
(52) U.S. Cl. .......................................... 385/24; 398/71
(58) Field of Classification Search ................ 385/131, 385/141, 24; 398/71
See application file for complete search history.

(56) References Cited

U.S. PATENT DOCUMENTS

| | | | |
|---|---|---|---|
| 5,178,728 A * | 1/1993 | Boysel et al. .................. 216/13 |
| 5,193,131 A | 3/1993 | Bruno |
| 5,657,338 A * | 8/1997 | Kitamura .................... 372/50.1 |
| 5,917,981 A * | 6/1999 | Kovacic et al. ............. 385/131 |
| 6,043,517 A * | 3/2000 | Presting et al. ............. 257/184 |
| 6,154,475 A * | 11/2000 | Soref et al. ............ 372/45.011 |
| 6,166,372 A * | 12/2000 | Yamamoto et al. ......... 250/225 |
| 6,330,265 B1 * | 12/2001 | Kinoshita ................. 372/50.12 |
| 6,437,375 B1 * | 8/2002 | Beaman ...................... 257/192 |
| 6,498,873 B1 * | 12/2002 | Chandrasekhar et al. ..... 385/28 |
| 6,559,471 B2 * | 5/2003 | Finder et al. .................. 257/22 |
| 6,677,655 B2 * | 1/2004 | Fitzergald .................... 257/432 |
| 6,815,735 B2 * | 11/2004 | Inoue et al. ................. 257/192 |
| 2002/0122447 A1 * | 9/2002 | Fukunaga et al. ............ 372/43 |
| 2003/0207127 A1 | 11/2003 | Murthy et al. |
| 2004/0004223 A1 * | 1/2004 | Nagahama et al. ............ 257/74 |

(Continued)

FOREIGN PATENT DOCUMENTS

EP 0 281 989 A1 9/1988

(Continued)

OTHER PUBLICATIONS

Presting H: "Near and mid infrared silicon/germanium based photodetection", Preparation and Characterization, Elsevier Sequoia, NL, vol. 321, No. 1-2, May 28, 1998, pp. 186-195, XP004147918.

*Primary Examiner*—Ellen Kim
(74) *Attorney, Agent, or Firm*—Sughrue Mion, PLLC

(57) ABSTRACT

An optical device integrally including an optical waveguide and an optical detector, and a method of manufacturing the same. The optical device includes: a substrate; a first single crystalline growth layer grown on the substrate; an optical waveguide provided with a clad layer and a core layer formed on the first single crystalline growth layer; a second single crystalline growth layer grown on a predetermined portion of a core layer at which the clad layer is removed, for absorbing light having a wavelength within a predetermined band and traveling in the optical waveguide.

22 Claims, 9 Drawing Sheets

U.S. PATENT DOCUMENTS

2004/0096175 A1 * 5/2004 Tolstikhin .................. 385/131

FOREIGN PATENT DOCUMENTS

| JP | 05-198829 | B1 | 8/1993 |
| JP | 06-265738 | B1 | 9/1994 |
| JP | 10-261809 | A | 9/1998 |
| JP | 2000-298218 | B1 | 10/2000 |

* cited by examiner

FIG. 1 (PRIOR ART)
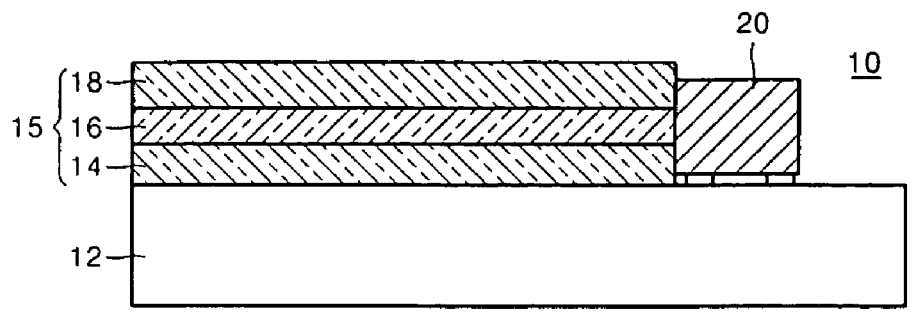
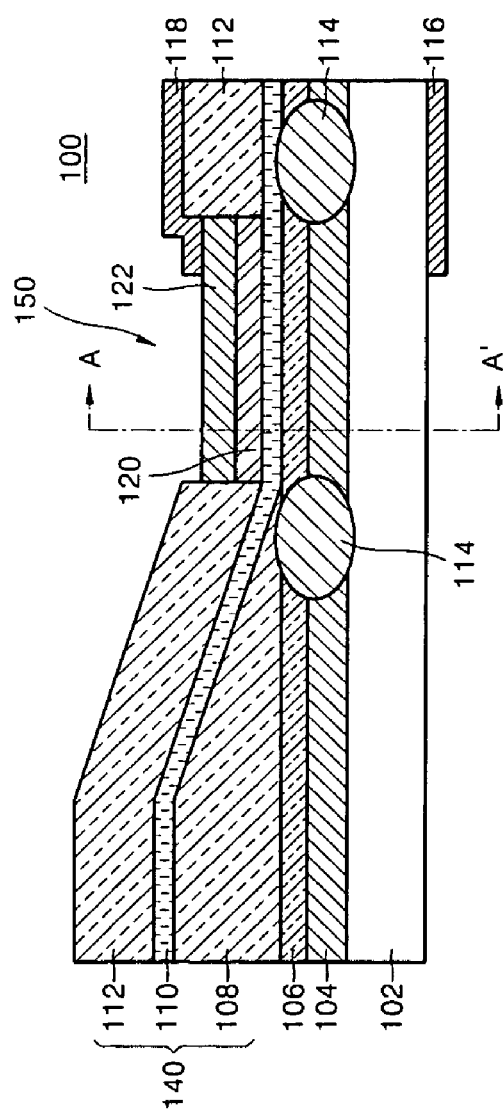
FIG. 2

OPTICAL DEVICE AND METHOD OF MANUFACTURING THE SAME

BACKGROUND OF THE INVENTION

This application claims the priority of Korean Patent Application No. 2003-92504, filed on Dec. 17, 2003, in the Korean Intellectual Property Office, the disclosure of which is incorporated herein in its entirety by reference.

1. Field of the Invention

The present invention relates to an optical device, and more particularly, to an optical device including, as an integral unit, an optical waveguide for guiding light and an optical detector for detecting the light, and a method of manufacturing the same.

2. Description of the Related Art

Recently, an optical communication network, which connects optical fibers to a plurality of subscriber terminals, has been actively studied so as to embody a high speed optical communication network. In addition, optical communication subscriber test networks have been established and operate in some regions so as to more widely spread optical communication.

An optical transceiver is essential for establishing such an optical communication network. The optical transceiver converts a digitalized electrical signal into an optical signal within a predetermined wavelength band, transmits the optical signal through an optical fiber, detects the optical signal within the predetermined wavelength band received through the optical fiber, and converts the optical signal back into a digitalized electrical signal.

FIG. 1 is a cross-sectional view of a conventional optical device integrally including an optical waveguide and an optical detector as portions of a receiver section of the optical transceiver.

Referring to FIG. 1, the conventional optical device 10 having an optical waveguide and the optical detector includes a silicon substrate 12, an optical waveguide 15 and an optical detector 20 made of InGaAs. The optical waveguide 15 includes a first clad layer 14 made of $SiO_2$, a core layer 16 made of $SiO_2$:Ge and a second clad layer 18 made of $SiO_2$. The first clad layer 14, the core layer 16 and the second clad layer 18 are sequentially formed on a predetermined region of the silicon substrate 12.

The conventional optical device 10 is manufactured using a hybrid integration method in which the optical detector 20 is finely adhered on a predetermined position of a silicon substrate 12 having the optical waveguide 15 thereon using a flip-chip bonding technique.

The hybrid integration method, however, makes the entire manufacturing process complex and lowers production yield. This is due to misalignment of core layers of an optical waveguide and an optical detector.

As a consequence, because much time and effort is required for fine alignment to thereby partially solve the above problems, and because expensive equipment is also necessary, the ability to reduce manufacturing cost is limited.

Furthermore, the separately manufactured optical detector is fabricated using a compound semiconductor suitable for a commonly used wavelength band. The substrate employed in the optical detector not only is expensive, but it is also difficult to lower production cost where mass production is limited by wafer diameter.

SUMMARY OF THE INVENTION

The present invention provides an optical device integrally including an optical waveguide and an optical detector, and a method of manufacturing the same.

According to a first aspect, the present invention provides an optical device including: a substrate; a first single crystalline growth layer grown on the substrate; an optical waveguide provided with a clad layer and a core layer formed on the first single crystalline growth layer; an undoped layer formed on a predetermined portion of the core layer where a portion of the clad layer has been removed so as to absorb light that travels along the optical waveguide within a predetermined wavelength band; a second single crystalline growth layer grown on the undoped layer; an n-type electrode formed on a side of the substrate; and a p-type electrode connected electrically to the second single crystalline growth layer.

According to another aspect, the present invention provides an optical device for detecting an optical signal within a predetermined wavelength band including: an optical waveguide provided with a clad layer and a core layer, for guiding the optical signal; and an optical detector including a light absorption region, for detecting the optical signal, wherein the light absorption region of the optical detector is adjacent to the core layer of the optical waveguide.

According to another aspect, the present invention provides a method of manufacturing an optical device for detecting an optical signal, including: growing a first single crystalline growth layer on a substrate; forming a first clad layer on the first single crystalline growth layer; patterning the first clad layer so as to impart a slope thereto and expose a portion of the first single crystalline growth layer; forming a core layer on the patterned first clad layer and the exposed single crystalline growth layer; forming a second clad layer on the core layer; exposing a predetermined region of the core layer by patterning the second clad layer in a predetermined shape; and forming a second single crystalline growth layer on the exposed core layer.

When the substrate is made of silicon, the first single crystalline growth layer and the second single crystalline growth layer may be silicon germanium layers.

The silicon germanium layer may be made of a silicon germanium compound ($Si_xGe_{1-x}$) having a graded composition, where x gradually decreases from 1 to 0 as the distance from the substrate increases so that a portion near the exposed core layer of the optical waveguide includes any one selected from the group consisting of a silicon germanium compound having a high germanium ratio (i.e., high content of germanium relative to silicon, where $0 \leq x \leq 0.4$) and pure germanium (x=0).

The portion made of any one selected from the group consisting of a silicon germanium compound having a high germanium ratio (where $0 \leq x \leq 0.4$) and pure germanium (x=0) may form the light absorption region.

When the substrate is made of InP, the single crystalline growth layers may be made of $In_xGa_{1-x}As$ where x ranges from 0 to 1, to form the light absorption region.

A difference in refractive index between the core layer and the clad layer may be sufficiently large to allow the core to have a small cross-sectional area.

The core layer is preferably made of silicon nitride, and the clad layer is preferably made of silicon dioxide.

An n-type electrode may be formed on a side of the substrate and a p-type electrode may be formed on the second single crystalline growth layer.

The optical device further includes an insulating layer under a portion where the optical detector is formed near the exposed core layer of the first single crystalline growth layer.

BRIEF DESCRIPTION OF THE DRAWINGS

The above and other features and advantages of the present invention will become more apparent by describing in detail exemplary embodiments thereof with reference to the attached drawings in which:

FIG. 1 is a cross-sectional view of a device including an optical waveguide, and an optical detector embodied using a hybrid integration method according to the related art;

FIG. 2 is a cross-sectional view of an optical device including an optical waveguide, and an optical detector integrally embodied according to a preferred embodiment of the present invention;

DETAILED DESCRIPTION OF THE INVENTION

Figure 3:
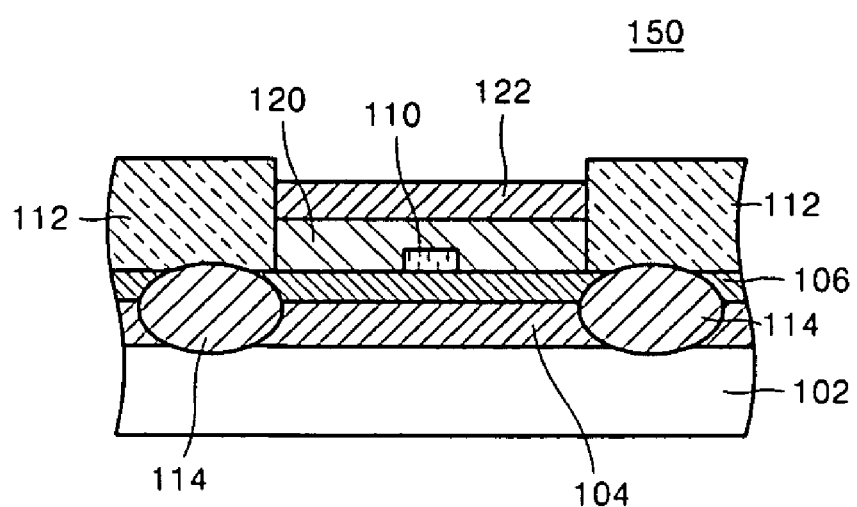
FIG. 3 is a cross-sectional view of an optical device taken along the line A–A' in FIG. 2.

Hereinafter, the present invention will be described in detail by explaining preferred embodiments of an optical device integrally including an optical waveguide and an optical detector, and a method of manufacturing the same with reference to the attached drawings. However, the present invention should not be constituted as being limited thereto. Like reference numerals in the drawings denote like elements.

FIG. 2 is a cross-sectional view of an optical device including an optical waveguide and an optical detector integrally embodied according to a preferred embodiment of the present invention. FIG. 3 is a cross-sectional view of an optical device taken along the line A–A' in FIG. 2.

Referring to FIGS. 2 and 3, an optical device 100 according to an embodiment of the present invention includes an optical waveguide 140 provided with first and second clad layers 108 and 112 and a core layer 110, and an optical detector 150 provided with a first silicon germanium layer 104, a first undoped layer 106, a second undoped layer 120 and a second silicon germanium layer 122.

The first silicon germanium layer 104 is formed on a predetermined region of a first side of a silicon substrate 102. The first undoped layer 106 is formed on the first silicon germanium layer 104. The optical waveguide 140 having a core layer 110 surrounded by the first and second clad layers 108 and 112 is formed on the first undoped layer 106. The optical detector 150 is made by subsequently forming the second undoped layer 120 and the second silicon germanium layer 122 on a predetermined region of the exposed core layer 110 of the optical waveguide 140.

In addition, the optical device 100 further includes an n-type electrode 116 and a p-type electrode 118. The n-type electrode 116 is formed on a predetermined region of a second side of the silicon substrate 102 such that the n-type electrode 116 may be connected electrically to the optical detector 150. The p-type electrode 118 is formed on a predetermined region of the second silicon germanium layer 122 such that the p-type electrode 118 may be connected electrically to the optical detector 150.

According to a first embodiment of the present invention, the optical device 100 receives an optical signal from the outside, and transmits the received optical signal to the second undoped layer 120 of the optical detector 150 through a core layer 110 of the optical waveguide 140. The second undoped layer 120 absorbs the transmitted optical signal and converts the absorbed optical signal into electron-hole pairs to output the converted signal through the electrodes 116 and 118 as an electric signal.

According to a preferred embodiment of the present invention, the optical waveguide 140 includes a core layer 110 and first and second clad layers 108 and 112. The core layer 110 is located at the center of the optical waveguide 140 and has a relatively large refractive index. The first and second clad layers 108 and 112 surround the core layer 110 and have a relatively small refractive index. Accordingly, light is propagated to the core layer 110 due to the total reflection phenomenon. Herein, only light satisfying a specific condition can propagate among various light wavelengths. The specific light satisfying the condition is called a mode. In general, since a single mode optical fiber is used for transferring a signal from the outside, it is preferable that the optical waveguide 140 is also designed to enable a single mode transfer.

Meanwhile the optical waveguide 140 is desirably formed to have a large difference in refractive index between the core layer 110 and the first and second clad layers 108 and 112. The reason is as follows. Since the size of a mode becomes smaller as the refractive index difference between the core layer 110 and the first and second clad layers 108 and 112 becomes larger, it is possible to design the core layer 110 to have a small cross-sectional area. Since the loss at a bent region is so small, the bending radius can be made small. Consequently, the device can be made small in size.

In a preferred embodiment of the present invention, the core layer 110 is made of silicon nitride ($Si_3N_4$) having a refractive index of about 2, and the first and second clad layers 108 and 112 are made of silicon dioxide ($SiO_2$) having a refractive index of about 1.5. In this case, since the refractive index difference is 30% or more, it is possible to decrease the size of the core layer 110 to a size of under some micrometers.

Meanwhile, in the optical detector 150, the light transmitted from the optical waveguide 140 is absorbed by the first and second undoped layers 106 and 120. Herein, in order to enable light absorption, the bandgap of the first and second undoped layers 106 and 120 should be smaller than the bandgap of the wavelength used to propagate through the optical fiber. Accordingly, the available material is limited.

In more detail, in order to absorb light within a wavelength range of 1.3 µm–1.5 µm used in an optical communication band, germanium in high stoichiometric ratio or pure germanium (x=0, Ge) is used as the silicon germanium compound ($Si_xGe_{1-x}$). In the case of pure germanium, since lattice mismatch with silicon is larger than 4%, if germanium is directly grown on a silicon layer, the defect density is too high to obtain crystalline growth of high quality. Accordingly, a silicon germanium buffer layer is desirably provided on the silicon substrate.

An important feature of the present invention is that high optical coupling efficiency is achieved with a simple configuration by integrating the optical waveguide 140 and the optical detector 150. In other words, the loss of light transmitted to the optical detector 150 through the optical waveguide 140 can thereby be minimized.

According to a preferred embodiment of the invention, because the core layer 110 of the optical waveguide 140 is present in the optical detector 150, reflection loss can be eliminated at the coupling portions of the optical waveguide 140 and the optical detector 150. Since an additional process or device for changing the direction of the light of the optical waveguide 140 toward the optical detector 150 is not needed, high optical coupling efficiency can be obtained in a simple manner.

FIGS. 4A through 4H are cross-sectional views illustrating a method of manufacturing an optical device including an optical waveguide and an optical detector integrally embodied according to another preferred embodiment of the present invention.

Figure 4A:
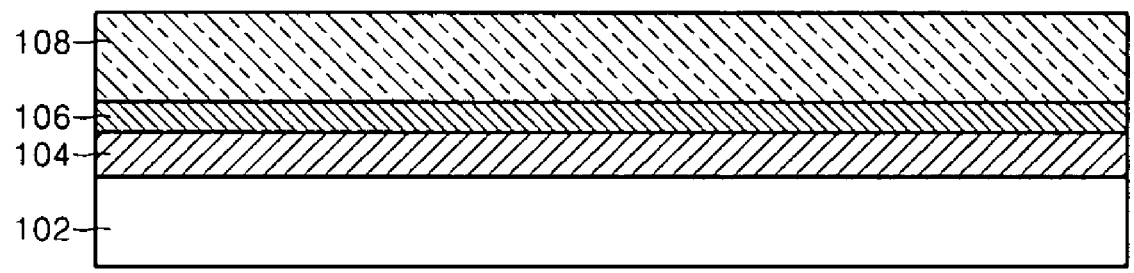
FIGS. 4A through 4H are cross-sectional views illustrating a method of manufacturing an optical device including an optical waveguide, and an optical detector integrally embodied according to a preferred embodiment of the present invention.

First, referring to FIG. 4A, an impurity doped first silicon germanium layer 104 is grown on a silicon substrate 102. According to a preferred embodiment of the present invention, an n-type doped silicon wafer is used as the silicon substrate 102. Accordingly, the case in which an n-type impurity is doped into a first silicon germanium layer 104 will be described, but the basic principle of using a p-type doped silicon substrate is also the same excepting that p-type and n-type are exchanged for each other.

Herein, in order to easily grow the silicon germanium compound containing a high germanium content or germanium component for use as the first undoped layer 106, the amount of germanium is gradually increased, in other words, x in $Si_xGe_{1-x}$ is gradually decreased from 1 to 0.

Sequentially, the first undoped layer 106 made of a silicon germanium compound containing a high germanium content or germanium component is continuously grown on the first silicon germanium layer 104.

Then, a first clad layer 108 is formed on the first undoped layer 106 having a predetermined thickness using a chemical vapor deposition (CVD) technique. Although the first silicon germanium layer 104 and the first undoped layer 106 are grown on the silicon substrate to be used to form the optical detector 150 in a preferred embodiment of the present invention, the optical detector can be formed of a material which can be grown in single crystalline form on a substrate made of InP or GaAs. If the substrate is made of InP, a single crystalline growth layer made of $In_xGa_{1-x}As$, where x ranges from 0 to 1, can be used.

Figure 4B:
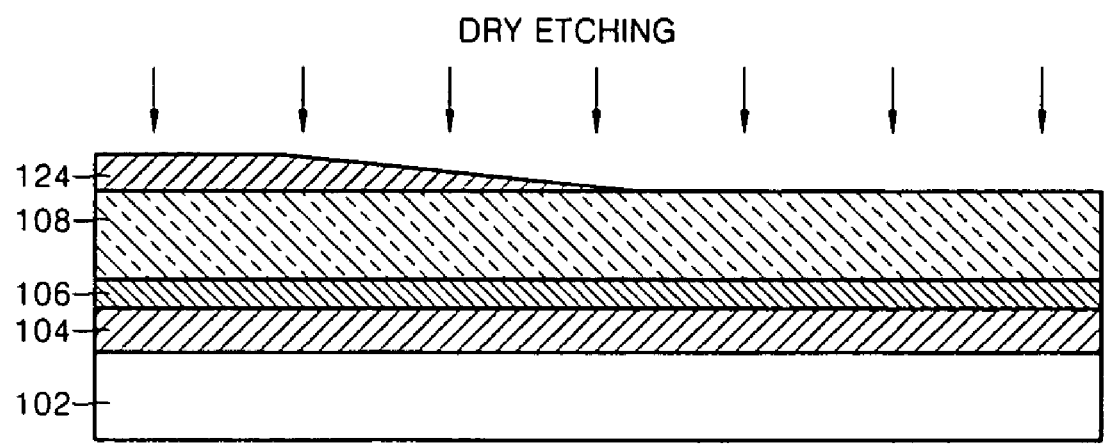
Figure 4C:
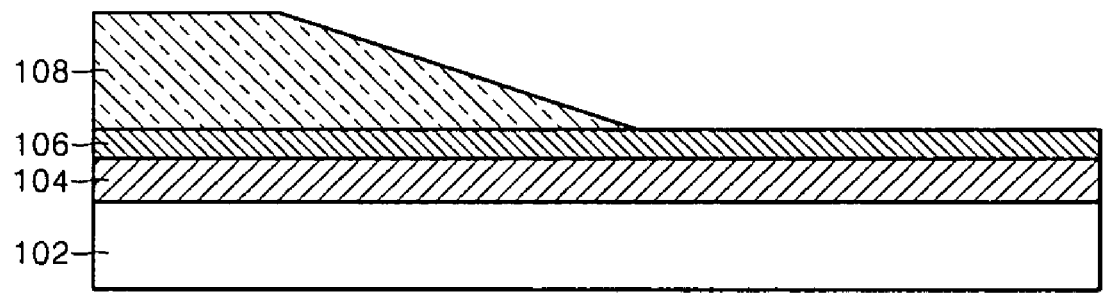

Referring to FIGS. 4B and 4C, a first photoresist layer 124 that is sloped and has non-uniform height is formed on the first clad layer 108 using a photolithography process in which a gray scale mask is used. Then, dry etching is performed on the first photoresist layer 124 so that the sloped first clad layer 108 is obtained.

Figure 4D:
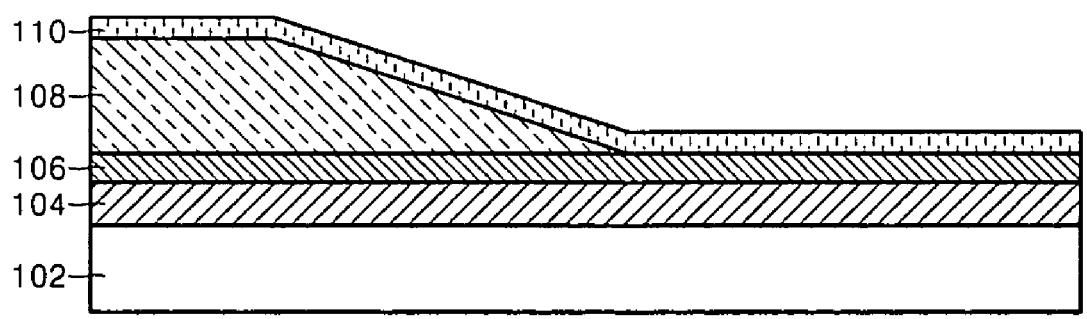

Referring to FIG. 4D, the material to be used as the core layer 110 is deposited on the sloped first clad layer 108 and on a portion of the undoped layer 106 that is not covered by the first clad layer 108. Then, only the core layer 110 having a specific cross-sectional area remains, and other portions are removed through photolithography and an etching process. In a preferred embodiment of the invention, a core layer 110 made of $Si_3N_4$ is deposited. The cross-section of the core layer has width of about 0.3 µm and height of about 0.3 µm.

Figure 4E:
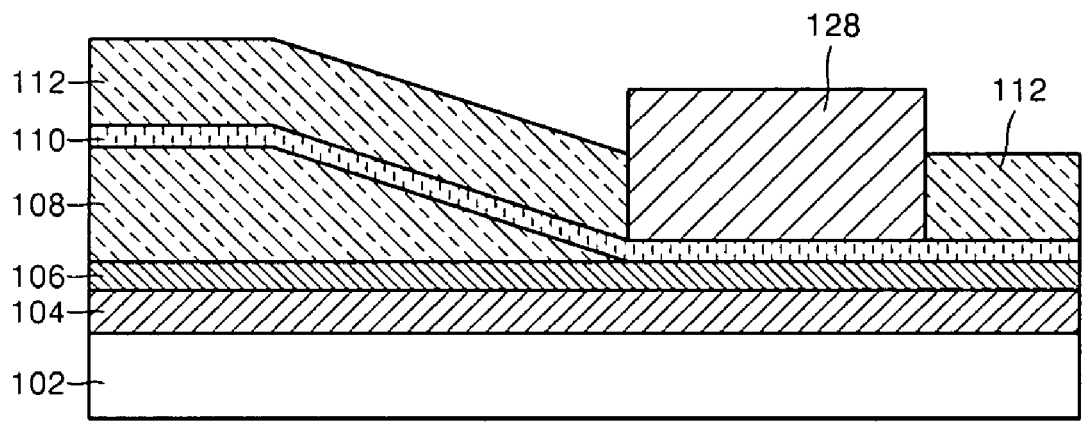

Referring to FIG. 4E, after a second photoresist layer 128 is formed using photolithography only on a region in which the optical detector will be formed, a second clad layer 112 is formed using a method such as sputtering. After the second photoresist layer 128 on the optical detector region is removed, the surface of the first undoped layer 106 excepting the core layer 110 of the optical waveguide 140 is chemically treated to subsequently allow for easy crystalline growth.

Figure 4F:
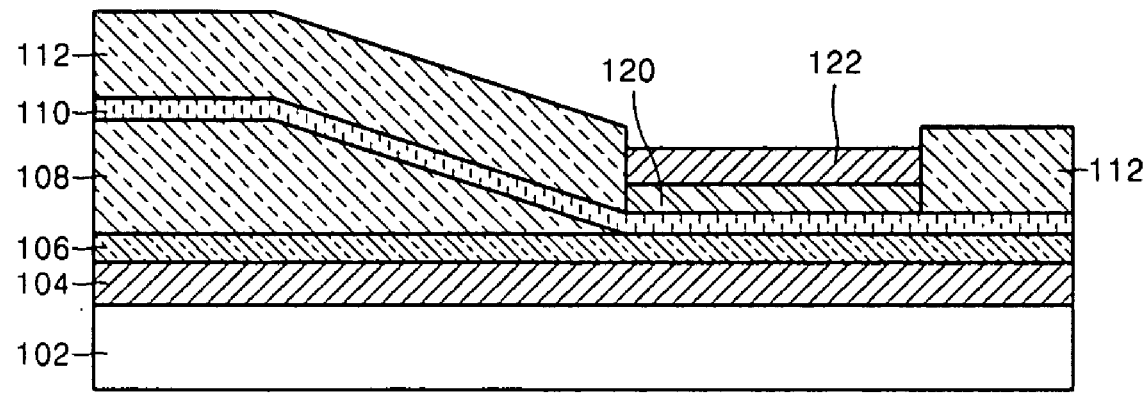

Next, referring to FIG. 4F, after the second undoped layer 120 is grown on the optical detector region, a second silicon germanium layer 122 is sequentially formed. In a preferred embodiment of the invention, the second undoped layer 120 is made of the same material as that of the first undoped layer 106, and the second silicon germanium layer 122 is made of p-type impurity doped silicon germanium.

Figure 4G:
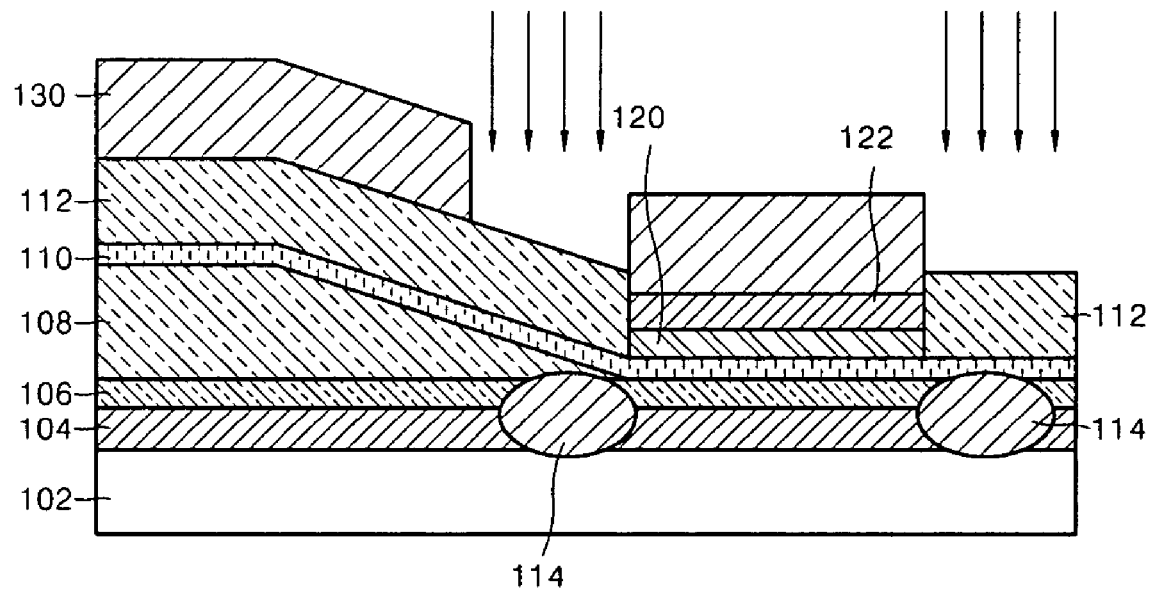

Then, referring to FIG. 4G, in order to ensure electrical insulation of the optical detector 150, a third photoresist layer 130 is formed as a passivation layer on the entire region excepting the circumferential portion of the optical detector. The electric insulating layer 114 is formed by ion implantation. The electrical insulating layer 114 promotes efficient operation of the optical detector 150 by enabling the second undoped layer 120 to absorb the light signal transferred through the core layer 110 of the optical waveguide 140 and to convert the light signal into electron-hole pairs, and then by confining the electron-hole pairs in the region of the optical detector 150.

Figure 4H:
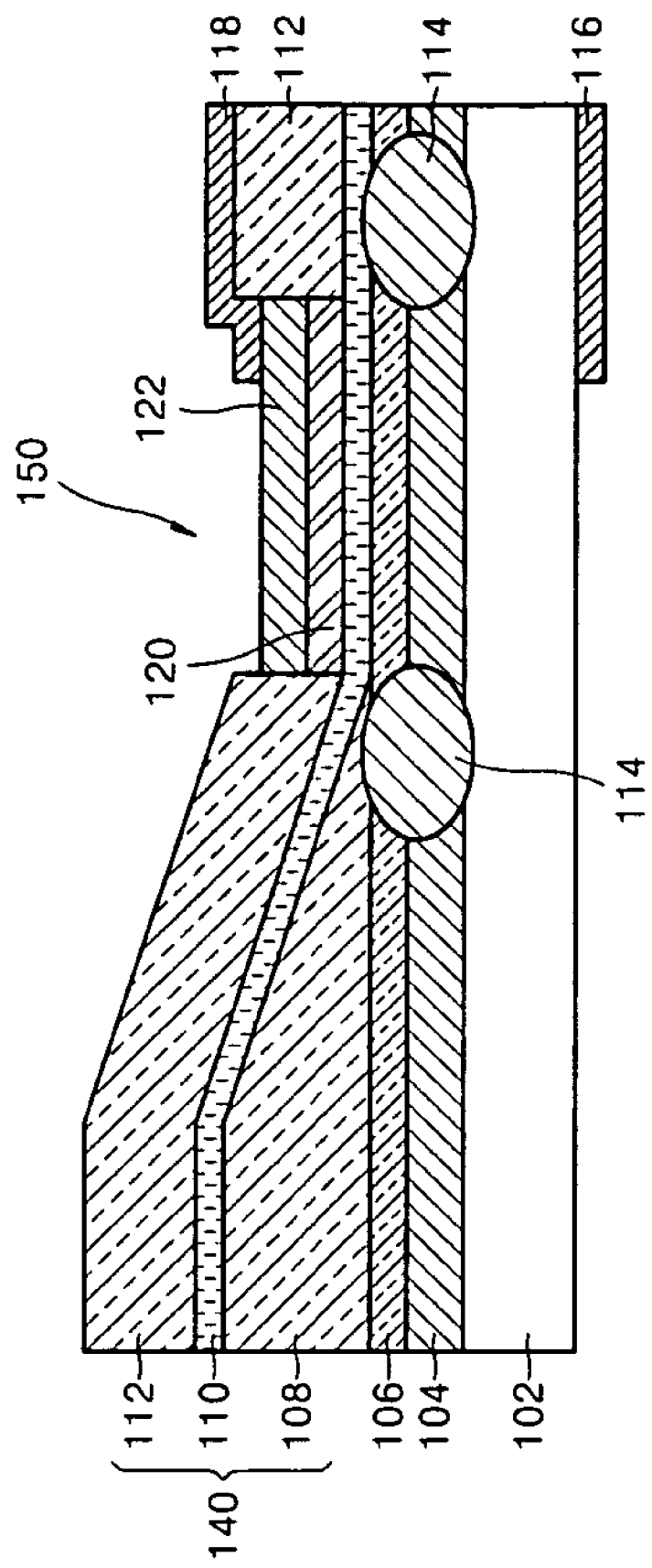

Finally, referring to FIG. 4H, after the third photoresist layer 130 is removed, a p-type electrode 118 and an n-type electrode 116 are formed. The p-type electrode 118 is formed on a predetermined region of the second silicon germanium layer 122 and electrically connected to the outside. The n-type electrode 116 is formed on a predetermined region of a second side of the silicon substrate and electrically connected to the outside.

Figure 5:
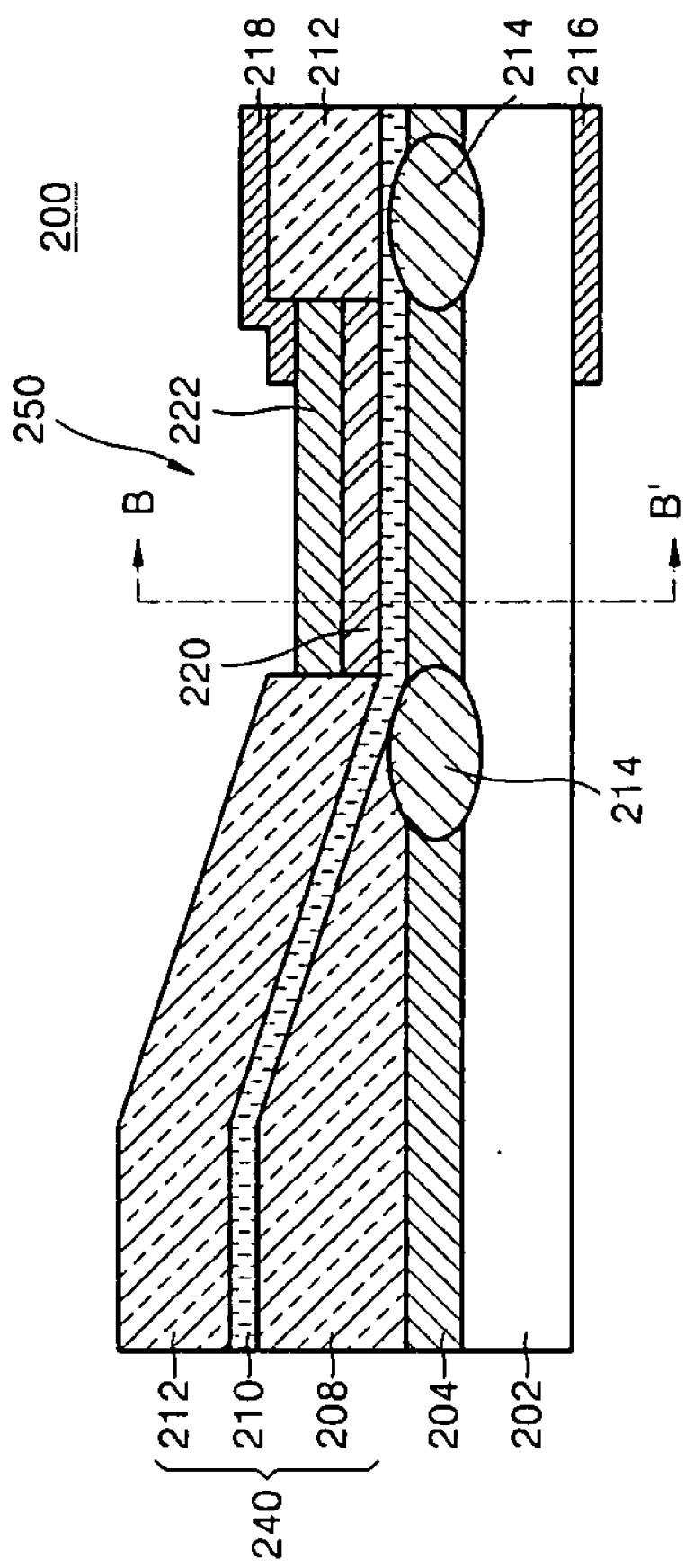
FIG. 5 is a cross-sectional view of an optical device including an optical waveguide, and an optical detector integrally embodied according to another preferred embodiment of the present invention.
Figure 6:
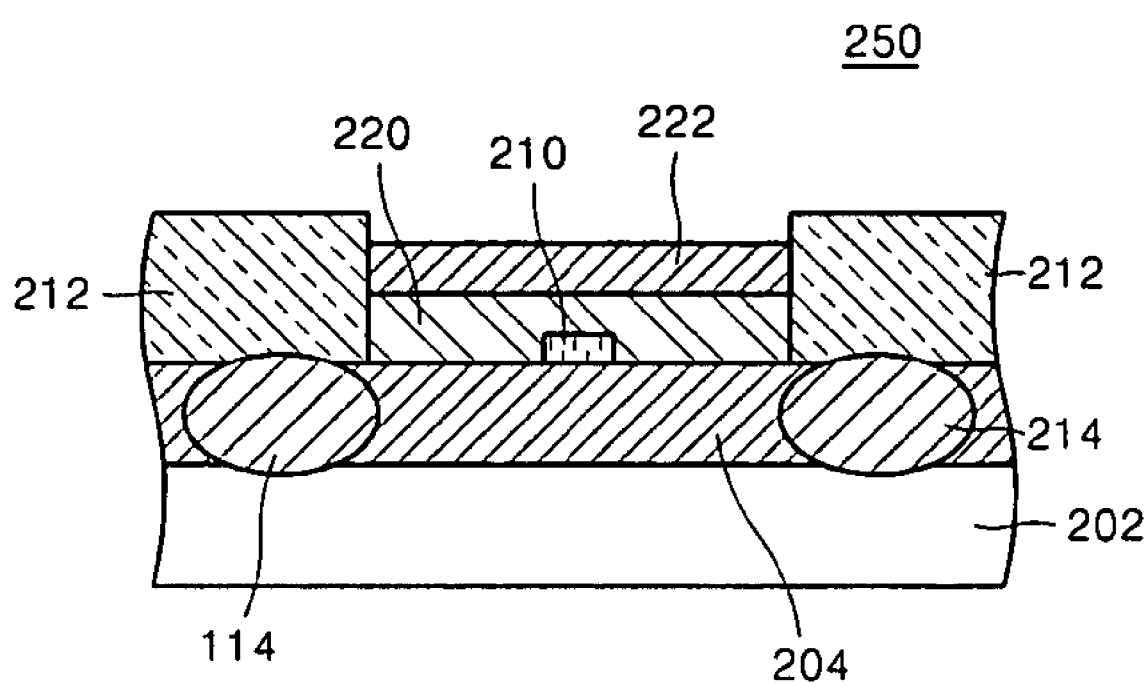
FIG. 6 is a cross-sectional view of an optical device taken along the line B–B' in FIG. 5.

FIG. 5 is a cross-sectional view of an optical device including an optical waveguide and an optical detector integrally embodied according to another preferred embodiment of the present invention. FIG. 6 is a cross-sectional view of an optical device taken along the line B–B' in FIG. 5.

The second embodiment of the present invention differs from the first embodiment in that the optical detector employs only a second undoped layer 220 without a corresponding first undoped layer 106 as in the first embodiment.

In more detail, there is no undoped layer for absorbing light under a core layer 210 of the light waveguide 240 and an undoped layer 220 is grown only on the exposed portion of the core layer 210 in the optical detector 250.

In the method of manufacturing an optical device 200 according to the second embodiment of the present invention, a first clad layer 208 is formed on a first silicon germanium layer 204 in the optical waveguide 240 without growing a first undoped layer 106. A core layer 210 is directly formed on a first silicon germanium layer 204 in the optical detector 250. Other processes are the substantially same as the first embodiment of the present invention shown in FIGS. 4A to 4H. Substrate 202 corresponds to substrate 102; layer 222 corresponds to silicon germanium layer 122; layer 214 corresponds to insulating layer 114; and electrodes 216 and 218 correspond to electrodes 116 and 118, respectively.

In the first embodiment of the present invention, the first and second undoped layers 106 and 120 are provided under and on the core layer 110 of the optical waveguide 140, respectively. The first embodiment has an advantage of absorbing most of the light transmitted to the core layer 110 of the optical waveguide 140 but a disadvantage in that defects can be caused due to introduction of impurities into the first and second undoped layers 106 and 120. This occurs by growing the second undoped layer 120 after growing the first undoped layer 106, depositing an insulating material, and performing photolithography and etching processes.

Accordingly, in the second embodiment of the present invention, in order to overcome the disadvantage of the first embodiment, an undoped layer 220 is grown on the optical detector 250 only after an optical waveguide 240 is manufactured so as to prevent unnecessary defects from being introduced into the undoped layer 220. As a result, as compared with the first embodiment of the present invention, in the second embodiment of the present invention, since it is possible to absorb a sufficient amount of light to detect an optical signal with an undoped layer 220 continuously grown without any defects, the optoelectric conversion of the optical detector 250 is effectively improved.

Figure 7A:
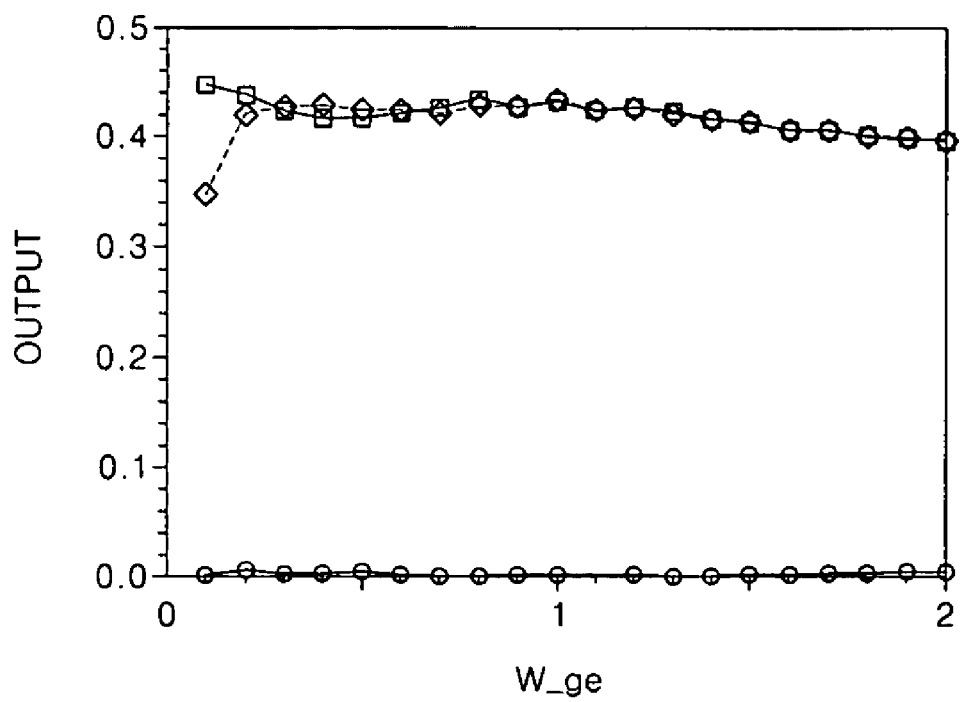
FIGS. 7A through 7B are graphs illustrating a simulation result representing the amount of light absorbed by the optical detector from the optical waveguide in the optical device integrally including the optical waveguide and the optical detector.
Figure 7B:
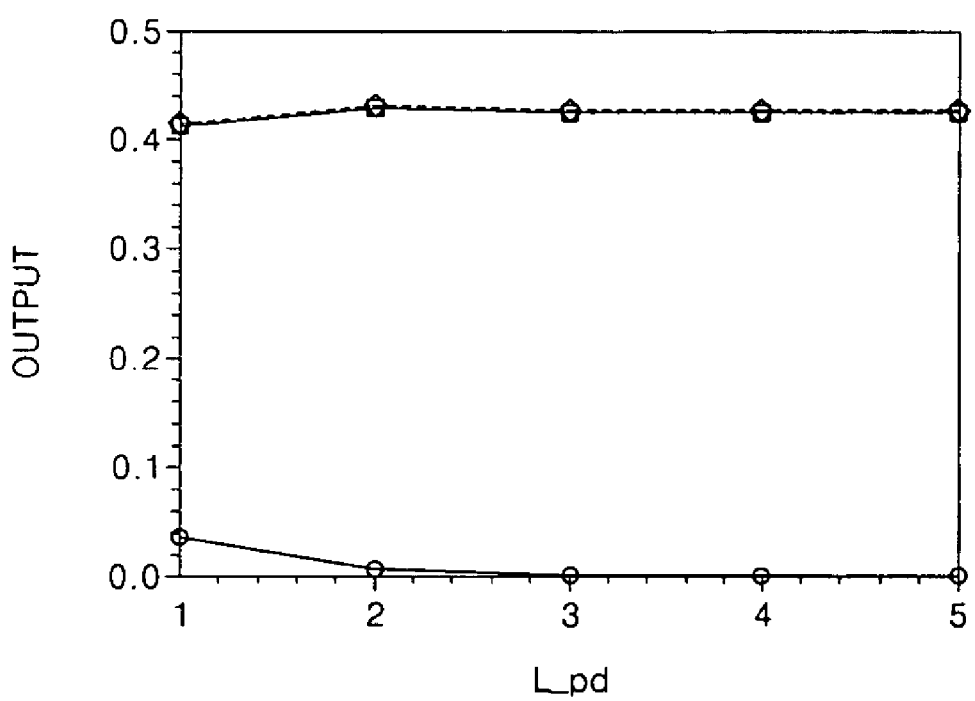

FIGS. 7A through 7B are graphs illustrating a simulation result representing the amount of light absorbed by the optical detector from the optical waveguide in the optical device integrally including the optical waveguide and the optical detector.

In FIG. 7A, the x-axis represents the thickness of the undoped layer and the y-axis represents a monitor output. □ represents the light amount absorbed by the second undoped layer 120, ◇ represents the light amount absorbed by the first undoped layer 106, and ○ represents the reflected light amount. As shown in the graph, if the first and second undoped layers have a thickness of 0.2 μm or more, the first and second undoped layers can absorb 40% or more of the light. Thus, 80% or more light absorption is possible.

In FIG. 7B, the x-axis represents the length of the undoped layer and the y-axis represents a monitor output. □ represents the light amount absorbed by the second undoped layer 120, ◇ represents the light amount absorbed by the first undoped layer 106, and ○ represents the reflected light amount. As shown in the graph, if the length of each of the first and second undoped layers is 2 μm or more, the first and second undoped layers can absorb 40% or more of the light. Thus, 80% or more light absorption is possible.

According to a preferred embodiment of the invention, the optical waveguide and the optical detector are integrated so that additional processes such as an alignment process and flip-chip boding are not necessary to thereby reduce production costs.

According to a preferred embodiment of the invention, the optical waveguide and the optical detector are not shorted. Rather, the core of the optical waveguide itself is employed in the optical detector so that the manufacturing process is simple and optical coupling efficiency can be improved.

According to a preferred embodiment of the invention, because an inexpensive single material of the silicon family and existing large silicon wafer production processes can be used, the optical transceiver can be innovatively lowered in price.

Since the method of manufacturing the present invention can be easily expanded and adopted for additional coupling to the optical device, a complex device can be manufactured using monolithic integration of the optical device at low cost.

While the present invention has been particularly shown and described with reference to exemplary embodiments thereof, it will be understood by those of ordinary skill in the art that various changes in form and detail may be made therein without departing from the spirit and scope of the present invention as defined by the following claims.

What is claimed is:

1. An optical device comprising:
   a substrate;
   a first single crystalline growth layer grown on the substrate;
   a first undoped layer on the first single crystalline growth layer;
   an optical waveguide provided with a clad layer and a core layer formed on the first undoped layer;
   a second undoped layer formed on a predetermined portion of the core layer where a portion of the clad layer has been removed so as to absorb light that travels along the optical waveguide within a predetermined wavelength band;
   a second single crystalline growth layer grown on the second undoped layer;
   an electrode of a first conduction type formed on a side of the substrate; and
   an electrode of a second conduction type electrically connected to the second single crystalline growth layer.

2. The optical device of claim 1, wherein the substrate is made of silicon and the first single crystalline growth layer and the second single crystalline growth layer are silicon germanium layers.

3. The optical device of claim 2, wherein the silicon germanium first single crystalline growth layer is made of a silicon germanium compound ($Si_xGe_{1-x}$) of graded composition, where x decreases from 1 to 0 as the distance from the substrate increases, so that a portion near an exposed core layer of the optical waveguide from which a portion of the clad layer has been removed comprises any one selected from the group consisting of a silicon germanium compound predominantly composed of germanium where $0 \leq x \leq 0.4$ and pure germanium.

4. The optical device of claim 3, wherein the first and second undoped layers comprise any one selected from the group consisting of a silicon germanium compound predominantly composed of germanium where $0 \leq x \leq 0.4$ and pure germanium.

5. The optical device of claim 1, wherein, the substrate is made of InP, and the single crystalline growth layers are made of $In_xGa_{1-x}As$, where x is from 0 to 1.

6. The optical device of claim 1, wherein a difference in refractive index between the core layer and the clad layer is 30% or more.

7. The optical device of claim 6, wherein the core layer is made of silicon nitride and the clad layer is made of silicon dioxide.

8. The optical device of claim 6, wherein the core layer is made of silicon and the clad layer is made of silicon dioxide.

9. The optical device of claim 1, further comprising:
   an insulating layer formed in the first single crystalline growth layer and the first undoped layer under peripheral portions of the second undoped layer and the second single crystalline growth layer.

10. An optical device for detecting an optical signal within a predetermined wavelength band comprising:
    a substrate;
    an optical waveguide disposed on the substrate, said optical waveguide provided with a clad layer and a core layer, for guiding the optical signal;

an optical detector comprising a first light absorption region and a second a light absorption region, for detecting the optical signal;

an electrode of a first conduction type formed on a side of the substrate; and an electrode of a second conduction type electrically connected to the optical detector, wherein the first light absorption region of the optical detector is arranged on the substrate and is adjacent to a lower surface of the core layer of the optical waveguide, and the second light absorption region is arranged on a portion of the core layer where a portion of the clad layer has been removed.

11. The optical device of claim 10, wherein each of the light absorption regions comprises a silicon germanium single crystalline growth layer.

12. The optical device of claim 11, wherein the silicon germanium single crystalline growth layer is made of a silicon-germanium compound ($Si_xGe_{1-x}$) of graded composition, where x increases from 0 to 1 as the distance from the core layer increases, so that a portion near the core layer comprises any one selected from the group consisting of a silicon germanium compound predominantly composed of germanium and pure germanium.

13. The optical device of claim 10, wherein a difference in refractive index between the core layer and the clad layer is 30% or more.

14. The optical device of claim 13, wherein the core layer is made of silicon nitride, and the clad layer is made of silicon dioxide.

15. The optical device of claim 13, wherein the core layer is made of silicon, and the clad layer is made of silicon dioxide.

16. The optical device of claim 15, further comprising:
an insulating layer formed in the first light absorption region under peripheral portions of the second light absorption region.

17. The optical device of claim 10, wherein the first light absorption region comprises a silicon germanium single crystalline growth layer arranged between the core layer and the substrate, and the second light absorption region comprises a single crystalline growth layer arranged between the core layer and the electrode, the single crystalline growth layer comprising a germanium layer and silicon germanium layer.

18. A method of manufacturing an optical device for detecting an optical signal, comprising:

growing a first single crystalline growth layer on a substrate;

forming a first undoped layer on the first single crystalline growth layer;

forming a first clad layer on the first undoped layer;

patterning the first clad layer so as to impart a slope thereto and expose a portion of the first undoped layer;

forming a core layer on the patterned first clad layer and the exposed first undoped layer;

forming a second clad layer on the core layer;

exposing a predetermined region of the core layer by patterning the second clad layer in a predetermined shape;

forming a second undoped layer on the exposed core layer;

forming a second single crystalline growth layer on the second undoped layer;

forming an electrode of a first conduction type on a side of the substrate; and forming an electrode of a second conduction type on the second single crystalline growth layer.

19. The method of claim 18, further comprising:
forming an insulating layer by implanting ions into the first single crystalline growth layer under peripheral portions of the second undoped layer and the second single crystalline growth layer first undoped layer.

20. The method of claim 18, wherein the first single crystalline growth layer comprises a layer made of a silicon germanium compound ($Si_xGe_{1-x}$) of graded composition, where x decreases from 1 to 0 as the distance from the substrate increases.

21. The method of claim 20, wherein the first undoped layer made of any one selected from the group consisting of a silicon germanium compound predominantly composed of germanium and pure germanium.

22. The method of claim 20, wherein the second undoped layer is made of any one selected from the group consisting of a silicon germanium compound predominantly composed of germanium and pure germanium, and the second single crystalline growth layer is made of a silicon germanium compound ($Si_xGe_{1-x}$) of graded composition, where x increases from 0 to 1 as the distance from the second undoped layer increases.

* * * * *